Feb. 19, 1963 A. E. PLOGSTEDT ETAL 3,078,379
TRANSISTOR POWER SWITCH
Filed Aug. 26, 1960
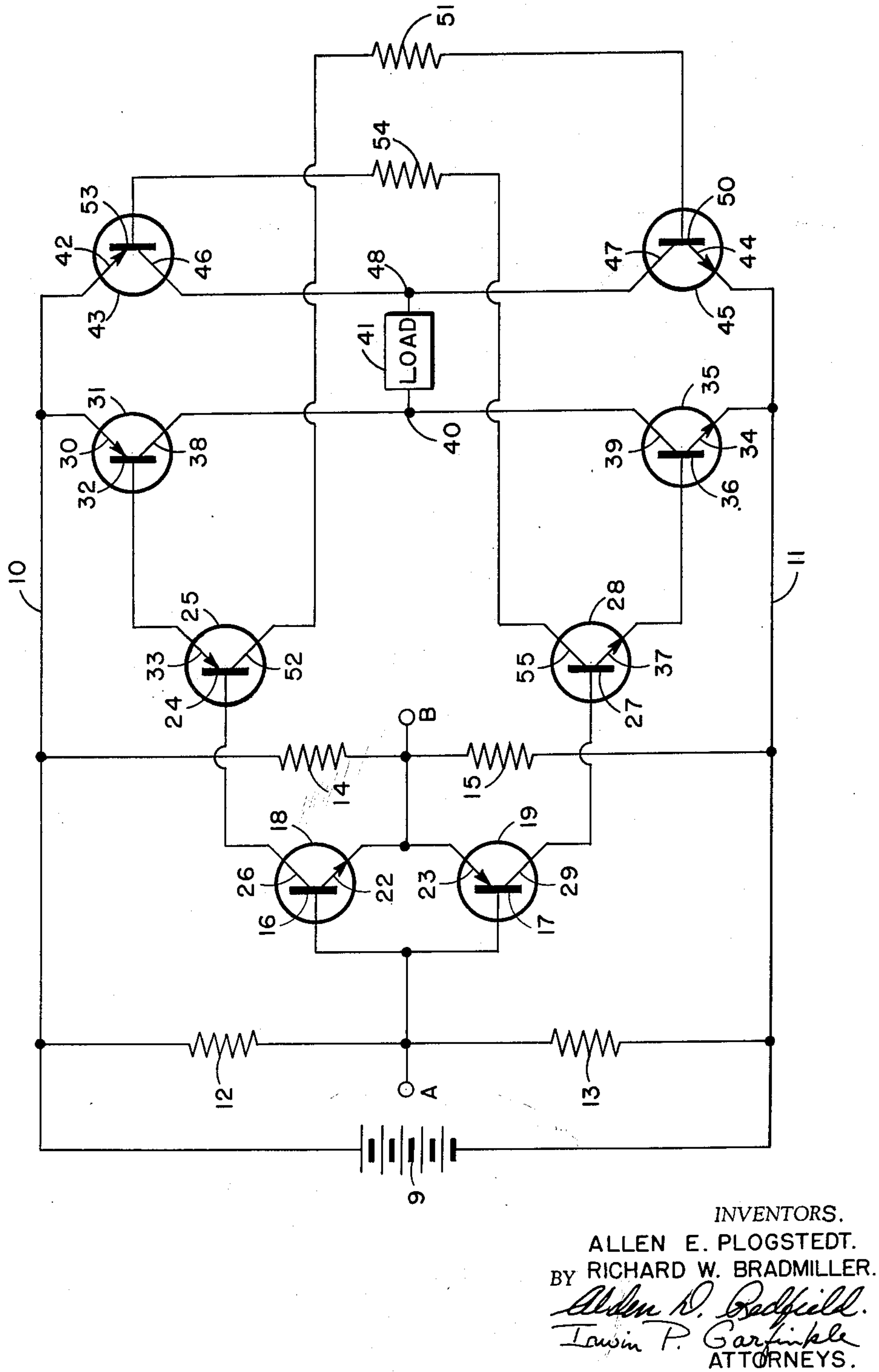
INVENTORS.
ALLEN E. PLOGSTEDT.
RICHARD W. BRADMILLER.
BY Alden D. Redfield.
Irwin P. Garfinkle
ATTORNEYS.

United States Patent Office 3,078,379
Patented Feb. 19, 1963

3,078,379

TRANSISTOR POWER SWITCH

Allen E. Plogstedt, Cincinnati, Ohio, and Richard W. Bradmiller, Winter Park, Fla., assignors to Avco Corporation, Cincinnati, Ohio, a corporation of Delaware Filed Aug. 26, 1960, Ser. No. 52,227
2 Claims. (Cl. 307—88.5)

This invention relates to a simple electronic system which performs the functions of a double pole, double throw switch without moving parts and providing power switching at speeds much higher than those resulting in available electro-mechanical relays.

Briefly described, this invention contemplates the establishment of a current path through a load in one direction by means of one pair of cascoded transistors and in the opposite direction by means of a second pair of cascoded transistors, the two transistors in each path being of opposite conductivity types. The circuit is arranged so that one pair of transistors will be fully conductive while the other pair is fully cut off, there being a very small transition period between full cutoff and full conduction.

It is, therefore, an object of the present invention to provide a novel transistorized reversing switch.

It is a further object of the present invention to provide a novel transistorized reversing switch incorporating two cascoded transistor pairs connected in a bridge circuit.

It is another object of the invention to provide a relatively wide bandwidth power amplifier of very high efficiency, capable of utilization in a digital go-no-go system with single-ended or differential input and push-pull bridge output.

A further object of the invention resides in the provision of a single electronic system capable of performing the function of a double pole, double throw switch and of operating at microsecond speeds.

While the primary object of this invention is to provide a transistorized switch, our invention offers additionally a stabilized, relatively wideband power amplifier of very high efficiency finding utility as an A.C. or D.C. servo amplifier of high accuracy.

The above and still further objects, features, and advantages of the present invention will become apparent upon consideration of the following detailed description of one specific embodiment thereof, especially when taken in conjunction with the accompanying drawing wherein the single FIGURE is a schematic circuit diagram of an electronic switch or amplifier, according to the invention.

Referring now more particularly to the accompanying drawing, there is illustrated an electronic switching system which can perform the functions of a double pole, double throw switch. D.C. voltage from a battery 9 or other suitable source is applied between leads 10 and 11, lead 10 being positive. Equal resistances 12 and 13 are connected in series between leads 10 and 11, and in parallel therewith resistances 14 and 15 are likewise connected in series between leads 10 and 11 to form a conventional Wheatstone bridge.

The bases 16, 17 of the transistors 18, 19 are jointly connected to terminal A at the junction of resistances 12 and 13, and the emitters 22, 23 of the transistors 18, 19 are jointly connected to the terminal B at the junction of resistances 14 and 15. The base 24 of a PNP transistor 25 is connected to the collector 26 of transistor 18, and the base 27 of an NPN transistor 28 is connected to the collector 29 of transistor 19.

The emitter 30 of a PNP transistor 31 is directly connected to lead 10, and its base 32 is connected to the emitter 33 of transistor 25. Similarly, the emitter 34 of an NPN transistor 35 is connected to lead 11, and its base 36 is connected to the emitter 37 of transistor 28. The collectors 38, 39 of transistors 31, 35 are jointly connected to one terminal 40 of load 41. Similarly, the emitter 42 of PNP transistor 43 is directly connected to lead 10, and the emitter 44 of NPN transistor 45 is directly connected to lead 11. The collectors 46 and 47 of transistors 43 and 45 are connected jointly to the other terminal 48 of load 41. In effect, the transistors 31, 35, 43, and 45 are connected in the form of a two-diagonal bridge with the input terminals at the lines 10 and 11 connected across one diagonal and with the output terminals 40 and 48 connected across the other diagonal. In the "balanced" state, none of the transistors are conducting; in the unbalanced state, transistors in two opposing legs are conductive and the remaining two are non-conductive.

The base 50 of transistor 45 is connected via current limiting resistance 51 to the collector 52 of transistor 25. The base 53 of transistor 43 is connected via current limiting resistance 54 to the collector 55 of transistor 28.

In operation, transistors 31 and 45 may be made jointly conductive to provide a current path from terminal 40 to terminal 48 through load 41. On the other hand, transistors 43 and 35 may be made jointly conductive to provide a current path in the opposite direction from terminal 48 to terminal 40 through load 41. More specifically, if the resistors 12, 13, 14, and 15 are balanced so that no voltage gradient exists between terminals A and B, then varying the values of resistance 12 above and below the value of resistance 13 will establish the operative states of the system. Decreasing the value of resistance 12 with respect to the value of resistance 13 increases the base-emitter voltage of transistor 18 in a positive sense, which increases its conductivity since it is of the NPN type. The conductivity of transistor 19 is concurrently decreased, since it is of the PNP type. Transistor 18 may now be conceived as a generator driving current into the base 24 of transistor 25. That transistor is, at its emitter 33, connected to the base 32 of transistor 31 and at its collector 52 to the base 50 of transistor 45. Since transistors 31 and 45 are of opposite conductivity types and specifically NPN and PNP, the effects of current drive by transistor 25 on transistors 31 and 45 are similar, both becoming highly conductive. The drive system for transistors 43 and 45 is analogous.

It is noted that the collector current versus voltage ($V_{ce}$) characteristic curve of a transistor rises near zero volts and remains essentially flat with but a slight rising slope to at least 20–30 volts. That is to say, over a predetermined minimum collector voltage, collector current will be essentially constant. Accordingly, the transistors 31, 43, 35, 45 operate essentially as switches, and system voltages are relatively unimportant so long as adequate drive currents are supplied, minimum collector voltages maintained, and maximum collector voltages not exceeded.

The system is self-regulating as respects current flow because in each current path the load is connected in a cascode circuit of two transistors. If either one of the transistors attempts to draw excess current the voltage across it will drop. Also, this type of degenerative circuitry, which is provided by the cascode connection, affords considerable increase in speed or system frequency response. The system is, in this sense, self-regulating, and the self-regulating properties render the system insensitive to circuit variations consequent to interchange of transistors. Any transistor capable of supplying the required current within its dissipation rating is capable of operating satisfactorily in the system.

In most applications, clipping is employed to protect the transistors from overload. In this case resistances 51 and 54 serve as protective or current-limiting devices. These resistances limit the switching action without materially affecting driving or regulating capabilities.

The described system has capability as a stabilized amplifier and as a wide bandwidth power amplifier of high efficiency. The system has capability also as an A.C. or D.C. servo amplifier of high accuracy, and it is so used in our co-pending application filed on even date and entitled "Servo Positioner System." The circuit can also operate with single-ended or differential input and provides push-pull output. In its basic configuration the system is useful as a switch, i.e., in a digital go-no-go system.

The advantages of the system derive, in part, from the utilization of transistors in the switching mode, yielding essentially no output current for zero input signal. Were the saturation resistance of transistors 31, 35, 43, 45 zero, the theoretical efficiency of the switched amplifier would be close to 100%. In practical systems wherein the saturation resistance is greater than zero, efficiencies of between 85% and 95% have been attained, actual values depending on the input signal.

The output stages employ complementary symmetry, i.e., each cascoded pair, as 31, 35 or 43, 45, are of opposite conductivity types. The utilization of complementary symmetry enables construction of a transformerless system having certain characteristics of a class B amplifier, i.e., high efficiency and essentially zero output for zero input signal, but possessing also the simplicity of circuitry generally found in class A amplifiers.

The use of complementary symmetry in push-pull transistor amplifiers is well known, as a broad principle of operation. Where one of the transistors is operating in the common emitter configuration, its D.C. quiescent load is the collector of an opposing stage. This provides a high load resistance and renders very difficult the problem of bias stabilization. In accordance with the present system wherein the transistors are operated in the switching mode, quiescent operating points of collectors are insignificant. What is of importance is voltage differential across the load and delivered current. In accordance with the present invention, for quiescent conditions, i.e., zero input signal, essentially no current flows. Voltage across the load is then essentially zero, and the collectors 38, 39, 46, 47 are all at ground potential.

Balancing of the system so that the collectors will be at ground potential which subsists midway between the potentials of leads 10 and 11 is assisted by the fact that units exhibiting the greatest I*eo* have also the largest voltage drop. Since I*eo* is approximately I*co* times current gain (beta) and since PNP transistors have the higher beta values, the intrinsic and normal properties of the cascoded transistors tend to assure that the collectors will be at ground for zero input signal.

Driving impedances are comparatively small, and by this condition transistor dynamic capacities are effectively swamped out, i.e., are ineffective to delay responses. Switching times of 1 to 2 microseconds are readily attainable and attain alpha cutoff rather than beta cutoff frequency values.

Typical circuit values are as follows:

| Resistances: | Ohms |
|---|---|
| 12, 13, 14, 15 | 4.7K |
| 51, 57 | 330 |

| Transistors: | Type |
|---|---|
| 18 | 2N35 |
| 19 | 2N34 |
| 25 | GT791 |
| 28 | GT792 |
| 31, 39 | 2N68 |
| 35, 41 | 2N95 |
| Load | 88 ohms |
| Voltage | 12 v. D.C. |

Operation of the system into one state or the other may be attained in response to .1 v. D.C. between base and emitter, and may be accomplished by selecting values of resistances 12, 13, 14, 15.

While we have described and illustrated one specific embodiment of our invention, it will be clear that variations of the details of constructions which are specifically illustrated and described may be resorted to without departing from the true spirit and scope of the invention as defined in the appended claims.

We claim:

1. In an electronic switch for reversing the direction of current from a direct current source through a load, the combination comprising: a Wheatstone bridge having input terminals and output terminals, said input terminals being connected across said source; first and second transistors of opposite conductivity types having base, emitter, and collector electrodes, said base electrodes being interconnected and said emitter electrodes being interconnected; said output circuit being connected across said base and emitter electrodes; third and fourth transistors, each having base, collector, and emitter electrodes, said third transistor being of an opposite conductivity type from said first transistor, the base electrode of said third transistor being directly connected to the collector electrode of said first transistor, said fourth transistor being of an opposite conductivity type from said second transistor, and the base electrode of said fourth transistor being directly connected to the collector electrode of said second transistor; an electronic switch, including fifth and sixth transistors of opposite conductivity types, each having base, collector, and emitter electrodes, said load being connected between said collector electrodes for conduction in one direction and said emitter electrodes being connected across said source, seventh and eighth transistors of opposite conductivity types, each having base, collector, and emitter electrodes, said load being connected between said collector electrodes for conduction in the opposite direction and said emitter electrodes being connected across said source; and connections from the emitter electrodes of said third and fourth transistors to the base electrodes of said fifth and eighth electrodes, respectively, and connections from the collector electrodes of said third and fourth transistors to the base electrodes of said sixth and seventh transistors, respectively, whereby an unbalance condition in said Wheatstone bridge will result in current flow through said load in one direction or in the opposite direction.

2. In an electronic switch for reversing the direction of current from a two-terminal direct current source through a load, in response to an input signal, the combination comprising:

a first PNP-type transistor and a first NPN-type transistor, each of said first transistors having base, emitter, and collector electrodes;

an electronic switch including a second PNP-type transistor and a second NPN-type transistor, each of said second transistors having base, emitter, and collector electrodes, said load being connected between said collector electrodes of said second transistors for conduction in one direction, said emitter electrodes of said second transistors being connected to opposite terminals of said source for forwardly biasing said emitter electrodes, and a third PNP-type transistor and a third NPN-type transistor, each of said third transistors having base, emitter, and collector electrodes, said load also being connected between said collector electrodes of said third transistors for conduction in the opposite direction, and said emitter electrodes of said third transistors also being connected between said opposite terminals for forwardly biasing said emitter electrodes;

connections from the emitter and collector electrodes, respectively, of said first PNP-type transistor to the base electrodes of said second PNP-type and NPN-type transistors, respectively;

and connections from the emitter and collector electrodes, respectively, of said first NPN-type transistor to the base electrodes of said third NPN-type and PNP-type transistors, respectively;

and means for applying said input signal to the base electrodes of said first transistors.

References Cited in the file of this patent

UNITED STATES PATENTS

| | | |
|---|---|---|
| 2,788,493 | Zawels | Apr. 9, 1957 |
| 2,821,639 | Bright et al. | Jan. 28, 1961 |